United States Patent
Mathijssen et al.

(10) Patent No.: US 10,585,363 B2
(45) Date of Patent: Mar. 10, 2020

(54) ALIGNMENT SYSTEM

(71) Applicant: ASML Netherlands B.V., Veldhoven (NL)

(72) Inventors: Simon Gijsbert Josephus Mathijssen, Rosmalen (NL); Arie Jeffrey Den Boef, Waalre (NL); Alessandro Polo, Delft (NL); Patricius Aloysius Jacobus Tinnemans, Hapert (NL); Adrianus Johannes Hendrikus Schellekens, Liempde (NL); Elahe Yeganegi Dastgerdi, Eindhoven (NL); Willem Marie Julia Marcel Coene, Geldrop (NL); Erik Willem Bogaart, Someren (NL); Simon Reinald Huisman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/575,069

(22) PCT Filed: Mar. 14, 2016

(86) PCT No.: PCT/EP2016/055388
§ 371 (c)(1),
(2) Date: Nov. 17, 2017

(87) PCT Pub. No.: WO2016/192865
PCT Pub. Date: Dec. 8, 2016

(65) Prior Publication Data
US 2018/0149987 A1    May 31, 2018

(30) Foreign Application Priority Data
Jun. 5, 2015 (EP) .................................. 15170832

(51) Int. Cl.
*G03B 27/52* (2006.01)
*G03B 27/68* (2006.01)
(Continued)

(52) U.S. Cl.
CPC ........ *G03F 9/7088* (2013.01); *G03F 7/70141* (2013.01)

(58) Field of Classification Search
CPC ....... G01B 11/14; G01B 11/002; G01B 11/26; G01B 11/00; G01B 11/02; G01B 7/14;
(Continued)

(56) References Cited

U.S. PATENT DOCUMENTS 6,141,107 A    10/2000  Nishi et al.
6,522,411 B1    2/2003  Moon et al.
(Continued)

FOREIGN PATENT DOCUMENTS

EP    1 148 390 A2    10/2001
EP    1 372 040 A2    12/2003
(Continued)

OTHER PUBLICATIONS

International Search Report and Written Opinion of the International Searching Authority directed to related International Application No. PCT/EP2016/055388, dated Jul. 13, 2016; 9 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

An alignment system, method and lithographic apparatus are provided for determining the position of an alignment mark, the alignment system comprising a first system configured to produce two overlapping images of the alignment mark that are rotated by around 180 degrees with respect to one another, and a second system configured to determine the
(Continued)

position of the alignment mark from a spatial distribution of an intensity of the two overlapping images.

15 Claims, 6 Drawing Sheets

(51) Int. Cl.
  *G03F 9/00* (2006.01)
  *G03F 7/20* (2006.01)
(58) Field of Classification Search
  CPC ...... G01B 9/02; G01B 11/026; G01B 11/028; G01B 11/03; G01B 11/043; G01B 11/161; G01B 11/22; G01B 11/24; G01B 11/2441; G01B 11/285; G01B 2210/306; G01B 7/31; G01B 9/02041
  See application file for complete search history.

(56) References Cited

U.S. PATENT DOCUMENTS

| | | | |
|---|---|---|---|
| 6,961,116 B2 | 11/2005 | Den Boef et al. | |
| 7,528,953 B2 | 5/2009 | Frommer et al. | |
| 8,208,139 B2 | 6/2012 | Hulsebos et al. | |
| 8,842,294 B2 | 9/2014 | Minoda et al. | |
| 2002/0175295 A1 | 11/2002 | Gordon et al. | |
| 2006/0061743 A1 | 3/2006 | Den Boef et al. | |
| 2007/0242253 A1* | 10/2007 | Visser | G03F 7/70058 355/67 |
| 2008/0239265 A1 | 10/2008 | Den Boef et al. | |
| 2010/0226562 A1 | 9/2010 | Wu et al. | |
| 2012/0057171 A1 | 3/2012 | Khuat Duy | |
| 2015/0109624 A1 | 4/2015 | Kreuzer et al. | |
| 2017/0277046 A1 | 9/2017 | Leung et al. | |

FOREIGN PATENT DOCUMENTS

| | | | |
|---|---|---|---|
| JP | H 07-142328 A | 6/1995 | |
| JP | H 08-288197 A | 11/1996 | |
| JP | 2004-148814 A | 5/2004 | |
| JP | 2006/091623 A | 4/2006 | |
| JP | 2007-149807 A | 6/2007 | |
| JP | 2008-532320 A | 8/2008 | |
| JP | 2009-177159 A | 8/2009 | |
| JP | 2013-030757 A | 2/2013 | |
| JP | 2017-532587 A | 11/2017 | |
| WO | WO 2013/189724 A2 | 12/2013 | |
| WO | WO 2014/026819 A2 | 2/2014 | |
| WO | WO 2014/146906 A2 | 9/2014 | |
| WO | WO 2015/000673 A1 | 1/2015 | |
| WO | WO 2014/068116 A1 | 5/2015 | |

OTHER PUBLICATIONS

International Preliminary Report on Patentability directed to related International Application No. PCT/EP2016/055388, dated Dec. 5, 2017; 6 pages.

* cited by examiner

ALIGNMENT SYSTEM

CROSS REFERENCE TO RELATED APPLICATIONS

This application claims priority of EP application 15170832.8 which was filed on 2015 Jun. 5 and which is incorporated herein in its entirety by reference.

FIELD

The present invention relates to an alignment system and method. The alignment system may form part of a lithographic apparatus.

BACKGROUND

A lithographic apparatus is a machine that applies a desired pattern onto a target portion of a substrate. Lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate (e.g. a silicon wafer). The pattern on the patterning device may correspond to an individual layer of an IC which is projected onto a target portion (e.g. comprising part of, one or several dies) on the substrate (e.g. a silicon wafer). In general, a single substrate will contain a network of adjacent target portions that are successively exposed.

A pattern which is projected by the lithographic apparatus is aligned with a pattern already present on a target portion of the substrate. In order to achieve this the lithographic apparatus is provided with an alignment system. The alignment system measures the positions of alignment marks provided on the substrate. These measurements are used to position the substrate during projection of the pattern onto the substrate.

It may be desirable to provide, for example, an alignment system which obviates or mitigates one or more of the problems of the prior art, whether identified herein or elsewhere.

SUMMARY

According to a first aspect of the invention, there is provided an alignment system for determining the position of an alignment mark, the alignment system comprising a first system configured to produce two overlapping images of the alignment mark that are rotated by around 180 degrees with respect to one another, and a second system configured to determine the position of the alignment mark from a spatial distribution of an intensity of the two overlapping images.

This alignment system is advantageous because it may be used to determine the position of a variety of different alignment marks rather than being restricted to use with a particular design of alignment mark.

The first system may comprise a non-coherent alignment radiation beam source configured to illuminate the alignment mark with an alignment radiation beam. This may advantageously allow a greater variety of light sources to be used when determining the position of an alignment mark. This may also advantageously avoid interference resulting from unwanted reflections occurring within the alignment system.

The first system may comprise optics that are configured to overfill the alignment mark with an alignment radiation beam. This may advantageously allow a region of interest of the image of the alignment mark to be selected.

The first system may comprise an imaging detector configured to detect the spatial distribution of the intensity of the two overlapping images of the alignment mark and provide an output signal indicative of the spatial distribution of the intensity of the two overlapping images of the alignment mark.

The second system may comprise a processor configured to determine the position of the alignment mark by analysing the spatial distribution of the intensity of the two overlapping images for a plurality of different positions of the alignment mark relative to the alignment system.

The processor may be configured to determine a position of a substrate comprising the alignment mark relative to the alignment system at which the two overlapping images of the alignment mark most fully overlap.

The first system may be configured to illuminate the alignment mark with an alignment radiation beam that is provided as a quadrupole mode. The use of a quadrupole mode is advantageous because it is particularly good at resolving gratings with small pitches.

The first system may comprise a plurality of alignment radiation beam sources configured to provide alignment radiation beams which illuminate the alignment mark and produce a plurality of images of the alignment mark. The plurality of alignment radiation beam sources may be configured to emit alignment radiation beams with different wavelengths. This may be advantageous because alignment mark images seen at the imaging detector for different wavelengths of incident radiation provide information about the alignment mark and how it has been influenced by layers of material deposited onto the substrate. For example, information regarding tilt of the alignment mark may be obtained using alignment radiation beams with different wavelengths.

The plurality of alignment radiation beam sources may be configured to provide separate alignment radiation beams which have different positions in a pupil plane.

The plurality of alignment radiation beam sources may be modulated.

Different alignment radiation beam sources may be modulated at different frequencies. Modulation may advantageously provide a method of discriminating between different images formed at the imaging detector.

The first system may comprise one or more alignment radiation beam sources configured to illuminate the alignment mark with a plurality of alignment radiation beams, and a modulator configured to modulate an alignment radiation beam.

Modulating an alignment radiation beam rather than an alignment radiation beam source may advantageously allow a single alignment radiation beam source having multiple outlets to be used to produce multiple alignment radiation beams having different wavelengths. This is because the alignment radiation beams may be modulated after being produced rather than whilst being produced, therefore multiple alignment radiation beam sources are not required to provide multiple alignment radiation beams having different frequencies of modulation applied to them.

Different alignment radiation beams may be modulated at different frequencies.

The modulator may modulate an amplitude of the alignment radiation beam.

The modulator may modulate a phase of the alignment radiation beam.

The second system may comprise a phase sensitive signal detector configured to receive a signal indicative of the modulation of a first alignment radiation beam and receive a signal indicative of the modulation of a second alignment radiation beam and receive a signal indicative of the spatial distribution of the intensity of the two overlapping images formed by the first alignment radiation beam and of the spatial distribution of the intensity of the two overlapping images formed by the second alignment radiation beam and discriminate between the two overlapping images formed by the first alignment radiation beam and the two overlapping images formed by the second alignment radiation beam. This may advantageously allow images formed at the imaging detector by different alignment radiation beams to be discriminated quickly.

The first system may comprise a balanced photodetector. A balanced photodetector may advantageously provide an output signal having an improved signal-to-noise ratio.

Four alignment radiation beam sources may be provided, the alignment radiation beam sources each being configured to provide an alignment radiation beam as one pole of a quadrupole illumination mode.

The second system may comprise an imaging detector located remotely from a controlled environment in which the alignment mark is provided, and alignment radiation being transported from the controlled environment to the imaging detector via an array of optical fibres.

The phase sensitive signal detector may comprise a lock-in amplifier.

The first system may comprise a plurality of radiation emitters located remotely from a controlled environment in which the alignment mark is provided. An alignment beam may be transported from a radiation emitter to the controlled environment via one or more optical fibres.

According to a second aspect of the invention there is provided a lithographic apparatus comprising at least two substrate tables for holding substrates, a projection system for projecting a patterned radiation beam onto a target portion of a substrate held by one of the substrate tables, and an alignment system according to any preceding paragraph for determining the position of alignment marks on a substrate held by the other substrate table. This lithographic apparatus advantageously allows for simultaneous lithographic exposure and alignment mark position determination.

According to a third aspect of the present invention, there is provided a method of determining the position of an alignment mark comprising producing two overlapping images of the alignment mark that are rotated by around 180 degrees with respect to one another, and determining the position of the alignment mark from a spatial distribution of an intensity of the two overlapping images.

The alignment mark may be illuminated with radiation that overfills the alignment mark.

The spatial distribution of an intensity of the two overlapping images for a plurality of different positions of the alignment mark relative to the alignment system may be analysed.

A position at which the two overlapping images of the alignment mark most fully overlap may be determined as being the position of the alignment mark.

A plurality of the two overlapping images of the alignment mark may be produced by different wavelengths of radiation and may be used to reconstruct the alignment mark.

A plurality of the two overlapping images of the alignment mark may be produced from different poles in a pupil plane and may be used to reconstruct the alignment mark.

A plurality of the two overlapping images of the alignment mark may be modulated.

The two overlapping images of the alignment mark may be modulated at different frequencies.

A plurality of the two overlapping images of the alignment mark may be discriminated between one another using modulation information.

According to a fourth aspect of the present invention, there is provided a lithographic method comprising using a projection system to project a patterned radiation beam onto a target portion of a substrate held by a first substrate tables, and simultaneously performing the alignment method of the third aspect of the present invention to determine the position of an alignment mark on a substrate held by a second substrate table. This lithographic method advantageously allows for simultaneous lithographic exposure and alignment mark position determination.

According to a fifth aspect of the invention, there is provided an alignment system for determining the position of an alignment mark on a substrate, the alignment system comprising an alignment radiation beam source configured to generate an alignment radiation beam, optics configured to direct the alignment radiation beam onto an alignment mark on the substrate, an self-referencing optical system configured to receive alignment radiation reflected from the alignment mark and direct that alignment radiation along first and second arms of the self-referencing optical system, the self-referencing optical system providing two images of the alignment mark, an imaging detector which is positioned to receive the two images of the alignment mark, the images overlapping to form a compound image, and a processor which is configured to analyse the compound image and thereby determine the position of the alignment mark relative to the alignment system.

The alignment system is advantageous because it allows alignment to be performed without being limited to a particular type of alignment mark.

The arms of the self-referencing optical system may be configured to apply a rotation to the alignment radiation such that, on exiting the self-referencing optical system, alignment radiation which has travelled along the first arm is inverted relative to alignment radiation which has travelled along the second arm. The term "inverted" as used herein is intended to mean that the alignment radiation has undergone a rotation of around 180 degrees. The term "inverted" is not intended to indicate a mirror image inversion.

The first system may comprise an LED alignment radiation beam source.

The alignment radiation beam source may be a non-coherent radiation source. This may advantageously avoid interference resulting from unwanted reflections occurring within the alignment system.

The optics may be configured to overfill the alignment mark with the alignment radiation beam. This advantageously allows a region of interest to be selected from the compound image received at the imaging detector.

The plurality of alignment radiation beam sources may be configured to emit alignment radiation beams with different wavelengths. This may advantageously allow the alignment mark to be reconstructed.

The plurality of alignment radiation beam sources may be configured to provide separate alignment radiation beams which have different positions in a pupil plane. This may also advantageously allow the alignment mark to be reconstructed.

According to a sixth aspect of the invention there is provided a lithographic apparatus comprising at least two substrate tables a substrate table for holding substrates, a projection system for projecting a patterned radiation beam onto a target portion of a substrate held by one of the substrate tables, and an alignment system according to the first aspect of the invention for determining the position of alignment marks on a substrate held by the other substrate table.

According to a seventh aspect of the invention there is provided a method of determining the position of an alignment mark on a substrate comprising directing an alignment radiation beam onto an alignment mark on the substrate, directing alignment radiation reflected from the alignment mark along first and second arms of a self-referencing optical system, using alignment radiation received from the first and second arms of the self-referencing optical system to form first and second images of the alignment mark on an imaging detector, the images overlapping to form a compound image, and analysing the compound image to determine the position of the alignment mark relative to the alignment system.

The method is advantageous because it allows alignment to be performed without being limited to a particular type of alignment mark.

According to an eighth aspect of the invention there is provided a lithographic method comprising using a projection system to project a patterned radiation beam onto a target portion of a substrate held by a first substrate tables, and simultaneously performing the alignment method of the third aspect of the invention to determine the position of an alignment mark on a substrate held by a second substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
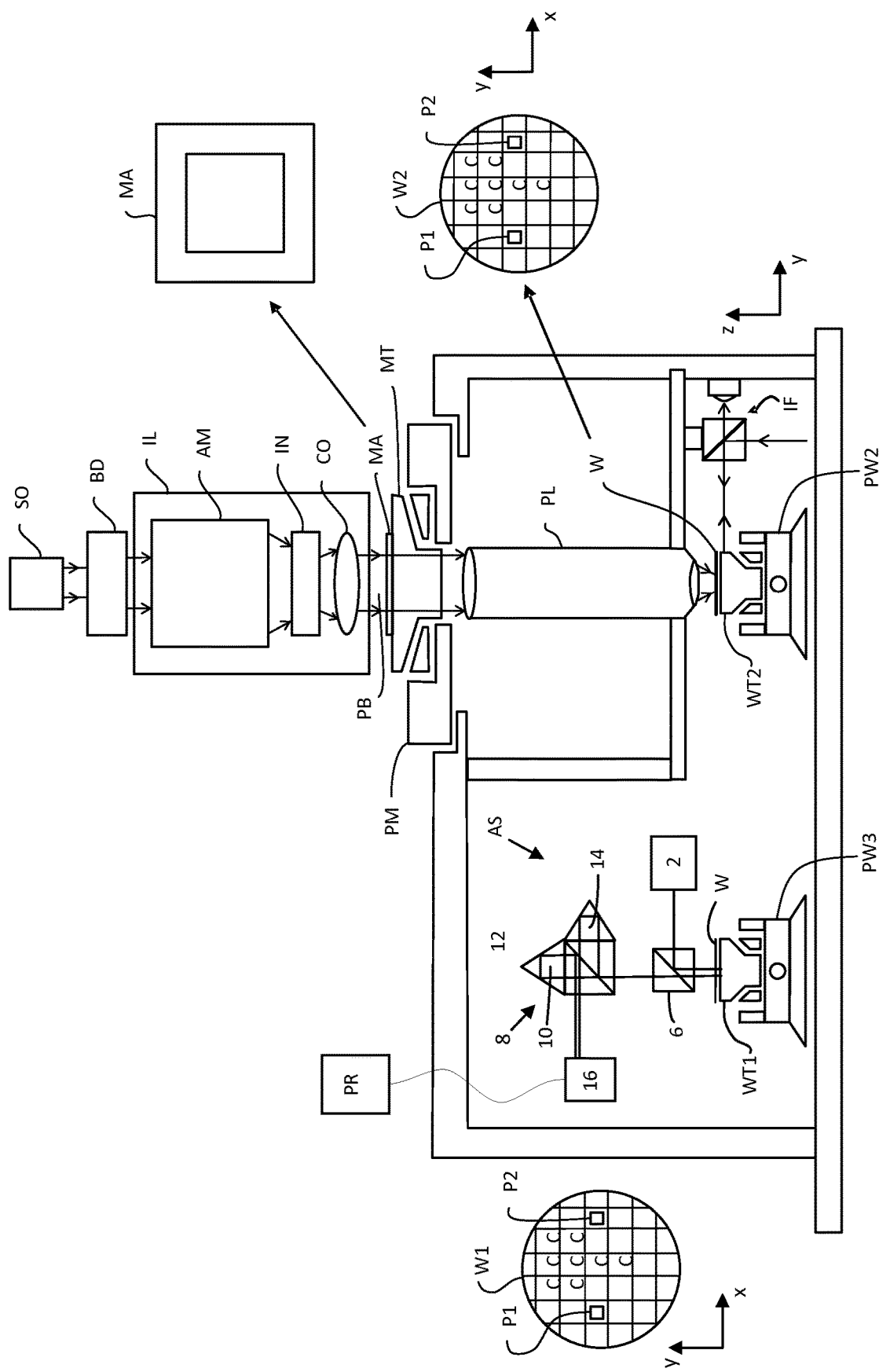
FIG. 1 depicts a lithographic apparatus and an alignment system according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate Immersion techniques are well known in the art for increasing the numerical aperture of projection systems.

FIG. 1 schematically depicts a lithographic apparatus according to a particular embodiment of the invention. The apparatus comprises:

an illumination system IL to condition a beam PB of radiation (e.g. DUV radiation or EUV radiation).

a support structure (which may be referred to as a mask table) MT to support a patterning device (e.g. a mask) MA and connected to first positioning device PM to accurately position the patterning device with respect to item PL;

a substrate table (which may be referred to as a wafer table) WT2 for holding a substrate (e.g. a resist coated wafer) W2 and connected to second positioning device PW2 for accurately positioning the substrate with respect to item PL;

another substrate table WT1 for holding a substrate W1 and connected to third positioning device PW3 for accurately positioning the substrate with respect to item AS; and a projection system (e.g. a refractive projection lens) PL configured to image a pattern imparted to the radiation beam PB by patterning device MA onto a target portion C (e.g. comprising one or more dies) of the substrate W2.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as -outer and -inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W2. With the aid of the second positioning device PW2 and position sensor IF (e.g. an interferometric device), the substrate table WT2 can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed.

The lithographic apparatus may for example move the patterning device MA and the substrate W2 with a scanning motion when projecting the pattern from the patterning device onto a target portion C. Cartesian coordinates are indicated in FIG. 1. As is conventional, the z-direction corresponds with an optical axis of the radiation beam PB. In an embodiment in which the lithographic apparatus is a scanning lithographic apparatus, the y-direction corresponds with the direction of scanning motion.

As depicted, the lithographic apparatus may be of a type having two (dual stage) or more substrate tables WT1, WT2. In a dual stage lithographic apparatus two substrate tables WT1, WT2 are provided in order to allow properties of one substrate W1 to be measured whilst exposure of another substrate W2 is taking place ("exposure of a substrate" means projection of patterned radiation onto the substrate as described above).

In the dual stage lithographic apparatus depicted in FIG. 1 an alignment system AS is provided on the left-hand side of the figure and the projection system PL is provided on the right-hand side of the figure. The alignment system AS measures the positions of alignment marks provided on a substrate W1 (schematically depicted by boxes P1, P2) which is held on a first substrate table WT1. A pattern is simultaneously projected by the projection system PL onto a substrate W2 held on a second substrate table WT2. When measurement of the substrate W1 supported by the first substrate table WT1 is completed and exposure of the substrate W2 supported by the second substrate table WT2 is completed, the positions of the substrate tables are swapped over. The substrate W1 supported by the first substrate table WT1 is then exposed using patterned radiation projected by the projection system PL. The already exposed wafer W2 supported by the second substrate table WT2 is removed from the substrate table for subsequent processing. Another substrate is then placed on the second substrate table WT2 for measurement by the alignment system AS prior to exposure using patterned radiation projected by the projection system PL.

Other measurement systems may be provided In addition to the alignment system AS used to measure the position of alignment marks on the substrates W1, W2. For example, a system which measures the topology of the surface of the substrate may be provided (this may be referred to as a level sensor). Such systems are not illustrated or described herein because they do not form part of the present invention.

An interferometer (not depicted) and/or other position measurement means may be used to monitor the position of the substrate table WT1 during alignment measurements. A processor PR may receive data from the alignment system AS and also receive substrate table WT1 position information. Since the substrate W is fixed on the substrate table WT1, position information relating to the substrate table may be taken as being position information relating to the substrate.

The alignment system AS comprises a radiation source 2 configured to provide a beam of radiation 4 which will be used to illuminate an alignment mark P1, P2. The radiation source 2 is hereinafter referred to as alignment radiation beam source 2. The alignment radiation beam 4 passes from the alignment radiation beam source 2 to optics which direct the alignment radiation beam onto the substrate W1. The optics may comprise a beam splitter 6 (e.g. a polarising beam splitter) and may comprise other additional components which are not depicted in FIG. 1. The alignment radiation beam 4 illuminates an alignment mark P1, P2 on the substrate W1, is reflected and passes through the beam splitter 6 to a self-referencing optical system 8.

The self-referencing optical system 8 comprises a polarizing beam splitter 10, a first corner cube reflector 12 and a second corner cube reflector 14. The alignment radiation 4 Is not polarized (or is circularly polarised) when it is received at the self-referencing optical system, and thus the polarizing beam splitter 10 transmits half of the alignment radiation beam and reflects the other half of the alignment radiation beam. The portion of the alignment radiation beam 4 which is transmitted by the polarising beam splitter 10 is reflected by the first corner cube reflector 12 and passes back to the polarising beam splitter. The reflection by the first corner cube reflector 12 causes a rotation by 90° of the polarization of the alignment beam. Since the polarization of the radiation has been rotated by 90°, it is reflected by the polarizing beam splitter 10 towards an imaging detector 16.

The portion of the alignment radiation beam 4 which is reflected by the polarizing beam splitter 10 passes to the second corner cube reflector 14 and is reflected by the second corner cube reflector. The reflection by the second corner cube reflector 14 causes a rotation by 90° of the polarization of the alignment radiation beam. Since the polarization of the reflected beam has been rotated by 90°, it passes through the polarizing beam splitter 10 and is incident upon the imaging detector 16.

Thus, the imaging detector 16 receives two images of the alignment mark P1, P2 that was illuminated by the alignment radiation beam 4. The effect of the self-referencing optical system 8 is such that one of the images has been rotated by 90° in a clockwise direction and the other image has been rotated by 90° in an anticlockwise direction. The images received at the imaging detector 16 are therefore rotated by around 180 degrees with respect to one another. The phrase "around 180 degrees" is intended to indicate that the two images may not be exactly rotated by 180 degrees with respect to each other but the alignment system may still be able to determine the position of the alignment mark accurately. In general, any angle of rotation of the images with respect to each other that still allows an accurate determination of the position of the alignment mark to be made may be considered as being a rotation of around 180 degrees. If the alignment mark P1, P2 has rotational symmetry for a rotation of 180°, then when the alignment mark is aligned with the alignment system AS, a single image of the alignment mark will be seen at the imaging detector 16. Moving the alignment mark P1, P2 away from alignment with the alignment system AS will cause the alignment mark images at the imaging detector 16 to move in opposite directions such that two partially overlapping images are seen. In general, images seen at the imaging detector 16 are indicative of the positions of alignment marks on the substrate P1, P2 and can be used to measure the positions of those alignment marks.

The components of the alignment system AS that contribute to producing two images of the alignment mark that are rotated by around 180 degrees with respect to one another may be referred to as a first system. For example, the first system may comprise the components within dashed line 70 in FIG. 2, the alignment radiation beam sources 2a-d, optical fibres 3a-d, the fibre coupler and the single optical fibre 3. The first system may comprise other components. The self-referencing optical system 8 may be considered to have two arms. The first arm comprises the first corner cube reflector 12 and the path travelled to and from the first corner cube reflector from a beam splitting face of the polarising beam splitter. The second arm comprises the second corner cube reflector 14 and the path travelled to and from the second corner cube reflector from a beam splitting face of the polarising beam splitter. The components of the alignment system AS that are used to determine the position of the alignment mark from a spatial distribution of an intensity of the two images may be referred to as a second system. That is, the second system may comprise the imaging detector 16 and the processor PR schematically depicted in FIG. 2. The second system may comprise other components.

Figure 2:
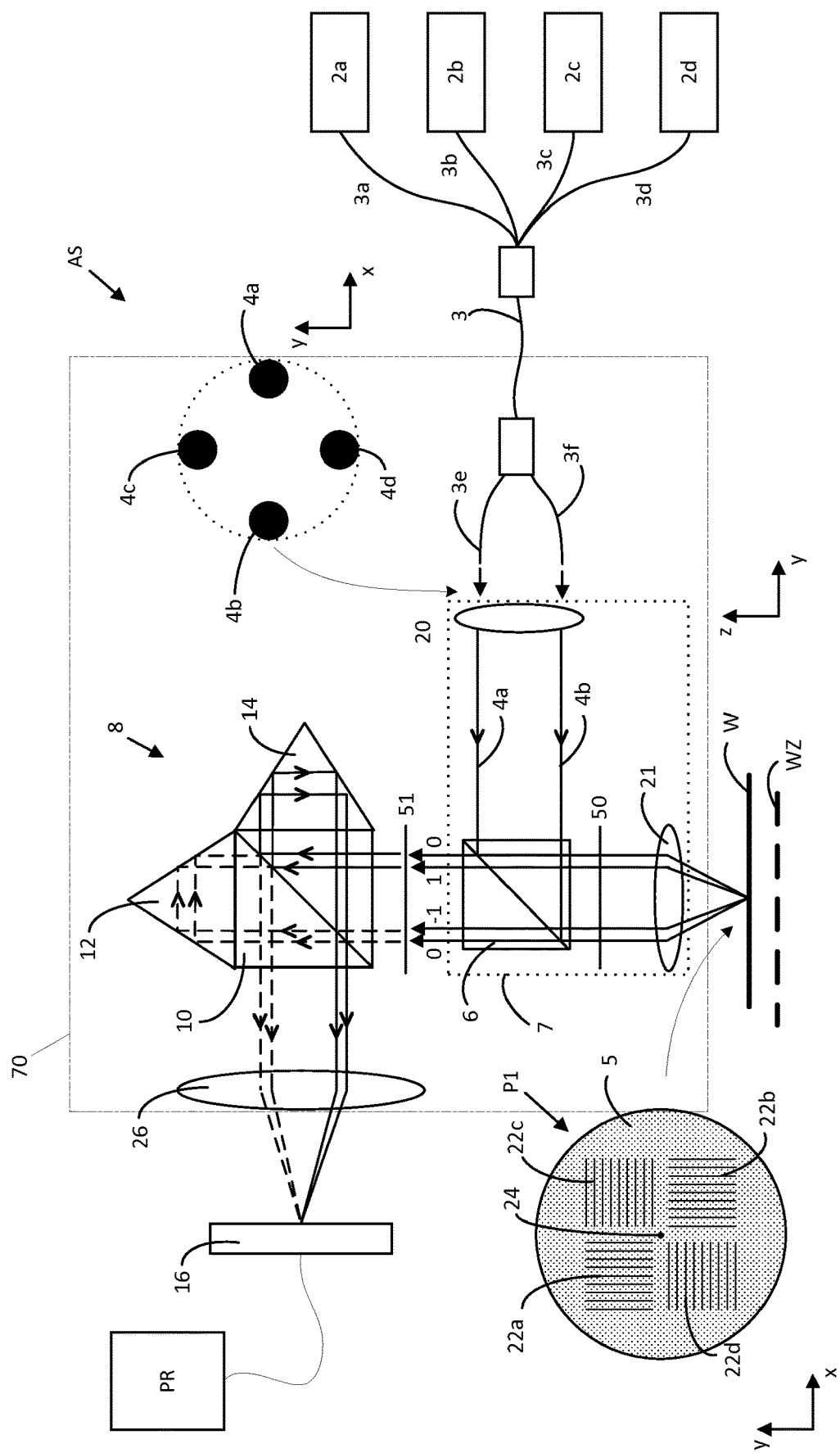
FIG. 2 schematically depicts the alignment system in more detail.

The manner in which the alignment system AS operates may be further understood with reference to FIG. 2, which depicts the alignment system in more detail. In the illustrated embodiment the alignment radiation beam source 2 comprises a plurality of LEDs 2a-d (although other forms of radiation source may be used). Each LED 2a-d is capable of emitting radiation at a power which is sufficiently high to illuminate an alignment mark P1 and generate an alignment mark image at the imaging detector 16. Such LEDs, which may be referred to as high power LEDs, are widely available. Each LED 2a-d may be configured emit radiation at a different wavelength and may be modulated for reasons which are explained further below. The radiation emitted by the LEDs 2a-d is non-actinic. That is, it does not cause exposure of resist provided on a substrate W. The radiation may for example be visible or infrared radiation, e.g. in the range 530-850 nm.

Each of the LEDs 2a-d is coupled to an optical fibre 3a-d which receives alignment radiation emitted by the LEDs. The optical fibres 3a-d are coupled by a fibre coupler into a single optical fibre 3 which transports alignment radiation to optics 7 which are used to direct the alignment radiation onto a substrate W. The LEDs 2a-d may be in a location which is remote from the beam splitter 6. For example, the LEDs 2a-d may be provided outside of an environment in which substrates W1, W2 are measured and exposed (see FIG. 1), with the optical fibre 3 passing through a wall and into that environment. This may be advantageous because the environment in which substrates are measured and exposed may be a controlled environment in order to minimise contamination, and providing the LEDs 2a-d outside of this environment may reduce the risk of contamination arising. This may particularly advantageous in an EUV lithographic apparatus which may be held at a vacuum because it avoids outgassing and other potential contamination issues. In addition it allows the LEDs to be cooled in a non-vacuum environment (this may be easier than cooling in a vacuum environment).

The optical fibre 3 is configured in this embodiment to provide the alignment radiation as a beam which comprises four poles 4a-d. That is, the optical fibre 3 splits into four fibres by a fibre coupler, two of which 3e, f are depicted. Each fibre 3e, f provides alignment radiation to a pole. Radiation leaving the fibres 3e, 3f is schematically depicted by arrows. The four poles may be considered to form a quadrupole mode. In other embodiments, the alignment radiation beam 4 may be provided in any other suitable form, including for example a simple disc-shaped mode or an annular mode. The use of a quadrupole mode is advantageous because it is particularly good at resolving gratings with small pitches.

The alignment radiation beam 4 passes through a lens 20. The lens 20 acts as a relay that images the radiation output from the fibres 3e, f into a pupil of a lens 21 which directs radiation onto the substrate W. In an embodiment, the lens 20 may be omitted and the radiation output from the fibres may be output directly into the pupil of the lens 21.

The polarising beam splitter 6 is used to direct the alignment radiation beam towards the substrate W. The radiation output from the fibres 3e, f in this embodiment is linearly polarised and has a polarisation that is reflected by the polarising beam splitter 6. A lens 21 located after the polarising beam splitter 6 focuses the alignment radiation beam to form a beam spot 5 on the substrate. The lens 21 may be a single optical element or may be a collection of optical elements (e.g. a microscope objective). The beam spot 5 is depicted as viewed from above on the left hand side of FIG. 2. As shown, the beam spot is larger than an alignment mark P1 upon which it is incident. This is referred to as overfilling the alignment mark. Overfilling the alignment mark is advantageous because it allows selection of a region of interest, i.e. the alignment mark within the area illuminated by the beam spot 5. This selection may be performed by the processor PR when analysing an image formed on the imaging detector 16.

Alignment radiation which is reflected from the alignment mark P1 passes back through the lens 21 and through the polarising beam splitter 6. A quarter wave plate 50 is positioned between the polarising beam splitter 6 and the substrate W and acts to rotate the polarisation of the alignment radiation. As a result of the action of the quarter wave plate 50, the polarisation of the reflected alignment radiation is rotated by 90 degrees relative to the radiation initially incident upon the polarising beam splitter 6, and the radiation is therefore transmitted by the polarising beam splitter.

The alignment mark P1 comprises two gratings 22a,b, which extend in the X-direction and two gratings 22c,d which extend in the Y-direction. The gratings may for example be etched into the substrate W. The gratings which extend in the X-direction 22a,b have the same pitch as each other, and the gratings which extend in the Y-direction have the same pitch as each other. Each grating 22a-d is provided in a different quadrant relative to a central point 24, with the X-direction gratings being provided on opposite sides of the central point and the Y-direction gratings being provided on opposite sides of the central point. The alignment mark P1 is symmetrical for a rotation of 180° about a central point 24. That is, if the alignment mark P1 were to be rotated by 180° about the central point 24 then it would have exactly the same appearance. The rotational symmetry of the alignment mark P1 allows the position of the alignment mark P1 to be determined using the depicted self-referencing optical system 8.

The propagation of rays of the alignment radiation beam 4 is now described with reference to FIG. 2. A first ray may be thought of as corresponding with the first pole 4a of the alignment radiation beam 4, and a second ray may be thought of as corresponding with the second pole 4b of the alignment radiation beam 4b. In order to avoid overcomplicating FIG. 2, propagation of only a subset of rays in the self-referencing optical system 8 is depicted, with rays in the first arm 12 being indicated by dashed lines and rays in the second arm 14 being indicated by solid lines.

The 1st ray 4a is focused onto the substrate W by the lens 21 to form the alignment beam spot 5 which illuminates the alignment mark P1. The X-direction gratings 22a,b of the alignment mark P1 generate diffraction orders. These are a zero diffraction order and a 1st diffraction order, both of which are depicted by lines in FIG. 2. Other diffraction orders will also be generated and may be captured by subsequent components of the alignment system AS. However, for simplicity these are not described or illustrated here. The zero and 1st order diffracted radiation propagates through subsequent components of the alignment system AS and is used to form an image on the imaging detector 16. If only zero order radiation was incident upon the imaging detector 16 then this would not allow an image of the gratings to be formed because the zero order radiation does not contain any structural information. If only the 1st order radiation was incident upon the imaging detector then an image would not be formed, because although this 1st order radiation has amplitude and phase generated by the gratings 22a,b it cannot create an image by itself. Mixing the zero order and 1st order radiation together provides an intensity profile which can be detected by the imaging detector 16. In other words, the mixture of the zero and 1st order diffracted radiation allows an image of the gratings 22a,b to be formed at the imaging detector.

The second ray 4b also forms the alignment beam spot 5 which illuminates the alignment mark P1. The alignment radiation is diffracted by the X-direction gratings 22a,b and forms a zero order and a −1st order, which are depicted by lines in FIG. 2 Other diffraction orders are generated but, as mentioned above, for simplicity are not described or illustrated. The zero and 1st diffraction orders propagate through subsequent components of the alignment and system and form an image on the imaging detector 16.

Although not depicted, the third and fourth poles 4c,d of the alignment radiation beam 4 are diffracted by the Y-direction gratings 22c,d and form images of those gratings on the imaging detector 16.

The self-referencing optical system 8, as described above in connection with FIG. 1, comprises a polarising beam splitter cube 10 and two corner cube reflectors 12, 14. A quarter-wave plate 51 is located before the polarising beam splitter cube 10 and converts the incident linearly polarised alignment radiation beam to a circularly polarised beam. The polarising beam splitter cube 10 then transmits half of the incident alignment radiation beam into the first arm 12 of the self-referencing optical system 8 and reflects the other half of the incident alignment radiation beam into the second arm 14 of the self-referencing optical system.

A lens 26 focuses the alignment radiation beam 4 which leaves the self-referencing optical system 8 onto the imaging detector 16. The lens forms a first image of the alignment mark P1 using radiation which passed through the first arm 12 of the self-referencing optical system 8, and forms a second image of the alignment mark using radiation which passed through the second arm 14 of the self-referencing optical system. These first and second images together form a compound image at the imaging detector 16. The compound image may be considered as being a spatial distribution of an intensity of the first and second images. Properties of the compound image are indicative of the position of the alignment mark P1 relative to the alignment system AS.

The self-referencing optical system 8 may be considered to be in a pupil space of an optical system formed by the lens 21 which focuses the alignment radiation beam 4 onto the substrate W and the lens 26 which focuses the alignment radiation beam onto the imaging detector 16. In other words, the lenses 21, 26 may be considered to form an optical system in which an object plane exists at the focal plane of the first lens 21 and an image plane exists at the focal plane of the second lens 26, the object plane corresponding with the alignment mark P1 (the object) and the image plane corresponding with the imaging detector 16 (where an image of the alignment mark is formed). A pupil plane (not labelled) exists between the lenses 21, 26 at the focal plane of the first lens 21. The space between the lenses 21, 26 in such an optical system may be referred to as a pupil space. No image of the alignment mark P1 is formed in the pupil space. Instead, a Fourier transform of the alignment mark exists in the pupil space. As schematically depicted in FIG. 2, in the pupil space rays of alignment radiation propagate substantially parallel to each other. This is advantageous because it allows propagation of rays along arms of the self-referencing optical system 8 and avoids the rays falling outside of an acceptance angle of the self-referencing optical system (i.e. propagating at an angle relative to an optical axis which is sufficiently large that the rays do not properly enter the self-referencing optical system. It is not essential that rays which enter the self-referencing optical system and propagating entirely parallel to one another. All that is required is that they are sufficiently close to parallel that they can enter and leave the self-referencing optical system such that they can then form an image on the imaging detector 16. However, the closer to parallel that the rays are provided, the greater the accuracy of the alignment system.

The effect of the self-referencing optical system 8 is now described. Considering the X-direction gratings 22a,b, if the alignment mark P1 were to be moved in the X-direction then the phase of the first diffraction order would change as a result of that movement. The movement of the phase is in a single direction because the alignment mark P1 is only moving in that direction. However, as explained above in connection with FIG. 1, the effect of the polarising beam splitter 10 and corner cube reflectors 12, 14 is to spilt incident radiation into two parts with opposite polarisations and then to rotate each part by 90° in opposite directions. As a result, one part is rotated by 180° relative to the other part. This means that the phase change which was initially in one direction is now in two directions, the directions being opposite to each other. When the alignment radiation beam is focused by the lens 26 onto the imaging detector 16 this is manifest as two separate images of the X-direction gratings 22a,b being formed, with the movement of the alignment mark P1 causing one image to move across the imaging detector 16 in a first direction and the second image to move across the imaging detector in the opposite direction. The self-referencing optical system 8 does not cause significant interference in the radiation which forms the two images of the alignment mark P1 because the two images of the alignment mark are formed from alignment radiation beams having orthogonal polarisations. Instead, two overlapping images of the alignment mark P1 are seen at the imaging detector 16. These two images may be considered to form a compound image. The compound image is the incoherent sum of the two overlapping images of the alignment mark P1 (a sum over intensity). The term "compound image" is intended to merely mean an image which is formed by the sum of two overlapping images at the imaging detector (without significant interference occurring between the images), and is not intended to imply that that image must have any particular form.

If the alignment beam spot 5 (and thus the alignment system AS in general) is not aligned in the X-direction with the alignment mark P1, then this misalignment will cause a separation in the X-direction of the alignment mark images seen at the imaging detector 16. Scanning movement of the substrate W in the X-direction will bring the alignment mark P1 towards alignment with the alignment system AS, and this will be manifest as the images of the alignment mark moving towards each other on the imaging detector 16. When the alignment system AS is fully aligned with the alignment mark P1 then the alignment mark images at the imaging detector 16 will fully overlap with each other and a single alignment mark image will be seen. Further movement of the substrate W in the X-direction will cause the alignment mark to move out of alignment with the alignment system and this will be manifest by the images of the alignment mark moving away from each other.

The processor PR receives an output image from the imaging detector 16 for each position of the substrate W relative to the alignment system. Each output image may be considered to be a compound image formed from the first image of the alignment mark and the second image of the alignment mark P1. The compound images are analysed by the processor to determine a substrate position at which the alignment mark P1 is aligned with the alignment system AS. This may for example correspond to a position in which the first and second images most fully overlap with each other. In practice, full overlap of images might not be seen, for example because the alignment mark P1 includes some asymmetry.

Measurement of the position of the alignment mark P1 in the y-direction is performed in the same manner using the two gratings 22c,d which extend in the y-direction.

There are various different operational modes which may be used to determine the position of the alignment mark P1. In a first mode the position of the substrate W is adjusted until the images of the alignment marks which have travelled through each arm of the self-referencing optical system 8 fully overlap with each other (as determined using image analysis performed by the processor PR). This is then recorded as the position of the alignment mark P1. The adjustment of the position of the substrate W may be performed in both the x and y-directions such that the position of the alignment mark P1 is determined in both the x and y-directions. The x-direction and y-direction position measurements may be performed separately from each other. Alternatively, they may be performed together. When the x-direction and y-direction position measurements are performed separately, a full overlap between the first and second images may be a full overlap in the direction which is being measured (e.g. full overlap in the y-direction is not required when the x-direction is being measured). In this mode the processor PR may analyse the images from the imaging detector directly, i.e. without them being first stored in a memory.

Figure 3A:
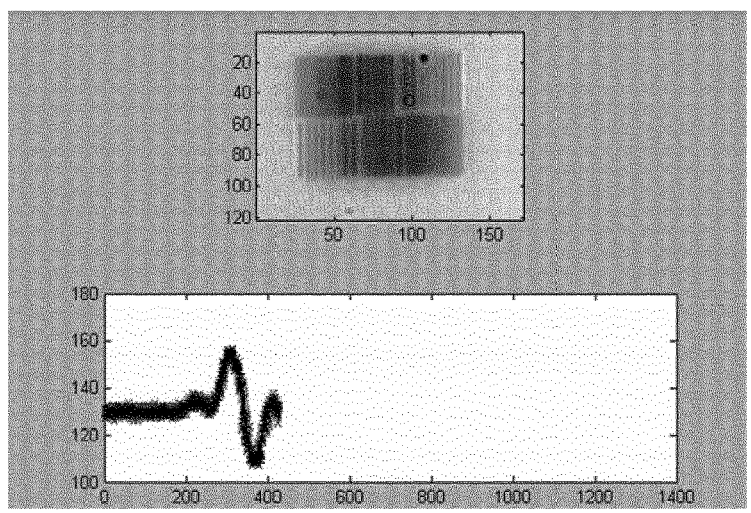
FIG. 3 depicts measurements made using an alignment system according to an embodiment of the invention.
Figure 3B:
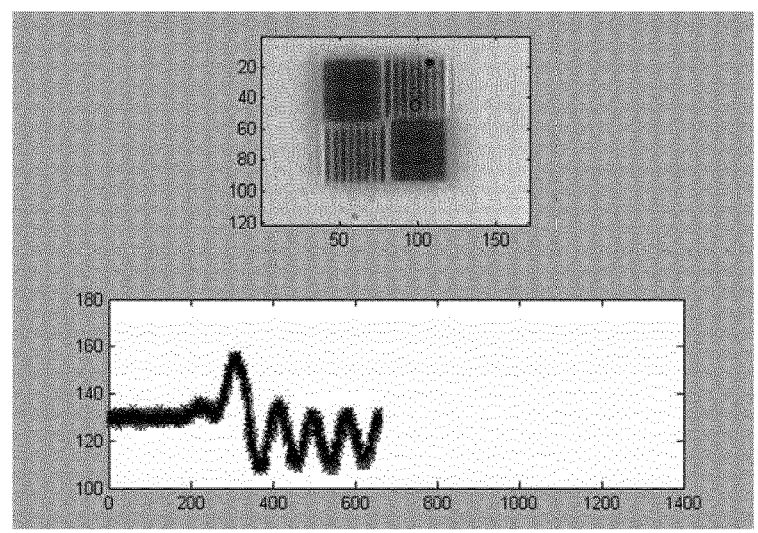
Figure 3C:
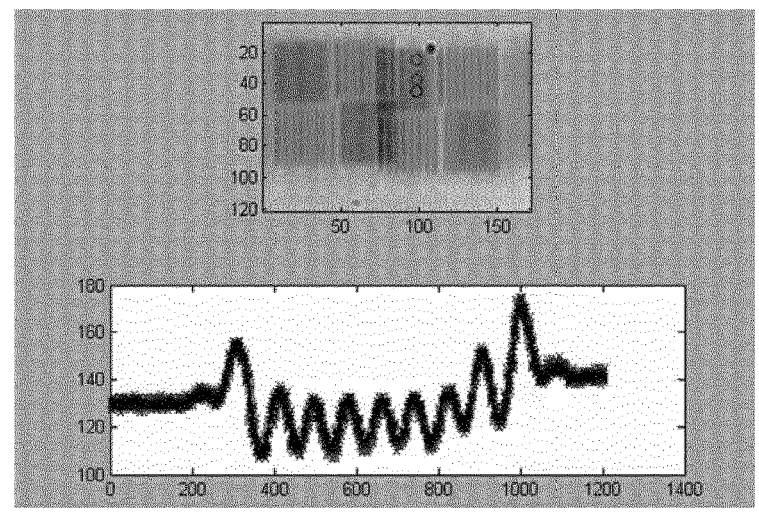

In a second mode of operation the substrate W is moved with a scanning motion relative to the alignment system AS and the resulting image data from the imaging detector 16 is recorded in a memory. FIG. 3 depicts some results which have been obtained using an alignment system according to an embodiment of the invention. The upper half of each of FIGS. 3a-c shows alignment mark images as seen by the imaging detector 16. Below each image is a chart which depicts the intensity of radiation seen at three pixel locations on the imaging detector 16. These three pixel locations are aligned in the x-direction (the direction in which the alignment measurement is being performed). They are depicted by circles which can be most easily seen in FIG. 3c. Peaks and troughs of intensity seen at those pixel locations are depicted in the plots. The figures depict the effect of scanning movement in the x-direction. The alignment mark comprises two gratings which extend in the x-direction and two gratings which extend in the y-direction. For simplicity, illumination of the alignment mark is by a dipole mode which comprises poles 4a,b (see FIG. 2) separated in the x-direction, as a result of which the gratings which extend in the y-direction are not resolved in the images of the alignment mark.

In FIG. 3a the scanning movement has moved the alignment mark P1 to a position where it is fully illuminated by the alignment beam spot 5 but is well away from being aligned with the centre of the alignment system. The images of the alignment marks partially overlap. The pixels on the imaging detector initially saw a background level of alignment radiation, and then saw a first peak and then a first trough as an outer line and then space of the alignment grating images overlapped at the pixels. FIG. 3b shows the alignment mark images when they are fully aligned with each other (or close to being fully aligned with each other) in the x-direction. At this point in the scanning movement of the substrate the pixels have seen four peaks and associated troughs and are at the centre of a fifth peak. FIG. 3c shows the alignment mark images as they move away from each other. At this point the pixels have seen nine peaks of alignment radiation and now see a substantially constant intensity of radiation because no further overlap of gratings of the alignment mark images occurs.

The position of the substrate during each measurement performed by the imaging detector 16 is recorded. The centre of the fifth peak seen by the imaging detector corresponds with the point where the two grating images fully overlap in the x-direction at the imaging detector 16 (the fifth peak corresponds with the centre of a nine line grating). The centre of the fifth peak may be determined by the processor PR in any suitable way using image data received from the detector 16 (e.g. via analysis of all of the images received from the detector during the scanning movement of the substrate W). The position of the substrate W which corresponds with the centre of the fifth peak is taken as being the position of the alignment mark P1 in the x-direction. The same operation may be repeated in the y-direction.

As has been explained above, image data corresponding with images received at the imaging detector 16 is processed together with position information indicative of the position of the substrate (recorded as the position of the substrate table WT) when those images are detected. Analysis of the detected images allows the substrate position which corresponds with full overlap of the alignment mark images in the x and y directions to be determined (e.g. by finding the centre point of a middle peak as described above). A plurality of alignment marks P1, P2 are provided across the surface of a substrate W. The positions of each of these alignment marks (or at least some of the alignment marks) are determined. The positions of the alignment marks P1, P2 are recorded by the lithographic apparatus and are then used during subsequent exposure of the substrate by the lithographic apparatus. During exposure of the substrate it is the relative positions of the alignment marks P1, P2 (i.e. their positions relative each other) which are important for accuracy of exposure. The absolute positions of the alignment marks P1, P2 in a universal frame of reference thus do not need to be determined.

As has been explained above, in some modes of operation the imaging detector captures images of the alignment marks during scanning movement of the substrate table WT. In order to allow a relatively fast scanning movement, the imaging detector 16 may be capable of capturing images relatively quickly. A scan speed used during alignment measurements may, for example, be of the order of 10 mm/s. The frame rate of the imaging detector 16 may for example be in the kHz range. The frame rate of the imaging detector 16 may, for example, be 10 kHz or more and may, for example, be 100 kHz or more. An imaging detector 16 with a frame rate of the order of MHz may be used.

Referring to FIG. 3, in order to determine the position of a peak which has a generally sine-wave form, it may be desirable to sample four or more points over one sine-wave period. The frame rate of the imaging detector 16 may be selected accordingly to allow four or more points on a peak to be sampled for a given substrate scan speed. To some extent there may be a trade-off between the number of pixels in the imaging detector 16 and the frame rate of that imaging detector. An imaging detector with millions of pixels is not required. Instead, as will be appreciated from FIG. 3, a relatively small number of pixels may be sufficient. For example, an imaging detector having at least 100×100 pixels will be sufficient. The components used to determine the position of the alignment mark from a spatial distribution of an intensity of the two images may be referred to as a second system. That is, the second system may comprise the imaging detector 16 and the processor PR. The second system may comprise other components.

The imaging detector 16 may for example be a CMOS sensor, a CCD array, or any other suitable form of imaging detector. In general, the imaging detector 16 may be any apparatus which is capable of detecting an image (e.g. an array of sensing elements). The imaging detector 16 may be at or adjacent to an image plane of the alignment system AS. The imaging detector 16 may be at or adjacent to a focal plane of the lens 26 which forms images of the alignment mark.

In the above description, two poles 4a, 4b of a quadrupole mode of alignment radiation are used when measuring the position of the alignment mark P1 in the x-direction. It is possible to measure the position of the alignment mark P1 using only one pole, but this is not preferred for the reason now explained. Illumination with one pole means that alignment radiation is incident upon the alignment mark P1 from generally one direction. For example, referring to FIG. 2, the pole 4a corresponds with the alignment radiation beam being incident upon the alignment mark from the right-hand side of the figure. If the substrate W is not in the correct plane but instead has been displaced downwards from its expected position, then this will cause an apparent movement in the −x-direction of the alignment mark P1 as seen at the imaging detector 16. In an example depicted in FIG. 2, a z-direction displaced position of the substrate is indicated by a dashed line WZ. The alignment radiation beam travels further before it is incident upon the substrate WZ as is depicted, and thus an apparent shift of the substrate in the −x-direction has taken place. This will result in an error in the measured position of the alignment mark P1.

Illumination of the alignment mark using radiation incident from an opposite direction (i.e. the opposite pole 4b in this example) will cancel out the error. This is because the radiation incident from the opposite direction will result in an apparent shift of the alignment mark in the opposite direction, in this case the x-direction. These two apparent shifts of the alignment mark cancel each other out and instead of a shift of the alignment mark image at the imaging detector 16 a loss of contrast at the imaging detector occurs. Provided that the loss of contrast is not sufficiently great that images of the alignment marks can no longer be resolved, the position of the alignment mark can be measured as described above without an error being caused by the z-direction direction displacement of the substrate.

The position of an alignment mark P1 may be measured in the manner described above using an alignment radiation beam generated using a single radiation beam source (e.g. a single LED). However, generating alignment radiation beams using a plurality of alignment radiation beam sources (e.g. a plurality of LEDs) may provide advantages. For example, four LEDs 2a-d, as depicted in FIG. 2, may each emit radiation at a different wavelength. In an embodiment, one of the LEDs may emit radiation at around 540 nm, another LED may emit radiation at around 850 nm, with the two other LEDs emitting radiation at wavelengths between those two wavelengths.

The 850 nm radiation is infrared radiation which will pass through layers of material such as metal which have been deposited onto the substrate, and be incident upon and diffracted by an alignment mark P1, P2 which is present below those layers. The infrared radiation thus allows the imaging detector 16 to see an image of the alignment mark P1 despite the fact that the alignment mark is located beneath a plurality of layers of material.

The radiation at 530 nm will not pass through a metal layer, but instead will be reflected by that metal layer. The alignment mark will typically be in the form of a grating etched into the substrate. Material layers which have been deposited on top of the alignment mark will tend to partially fill in the etched alignment mark but will not provide a fully flat outer surface. In other words, some of the shape of the alignment mark remains after material layers have been deposited upon it. The 530 nm radiation provides an image at the imaging detector 16 of the outer layer of material and thus provides an image of the mark, as modified by the layers of material, at the imaging detector 16. If the alignment mark images seen at the imaging detector 16 using 530 nm radiation have strong peaks and troughs, then this may be indicative that the alignment mark remains well defined even after the layers of material have been added. Conversely, if the contrast between peaks and troughs seen at the imaging detector is low, then this may be indicative that the alignment mark has been substantially smoothed out by the addition of layers of material.

In general, the alignment mark images seen at the imaging detector for different wavelengths of incident radiation provide information about the alignment mark and how it has been influenced by layers of material deposited onto the substrate. For example, information regarding tilt of the alignment mark may be obtained, as is explained further below.

The different wavelengths of radiation may be emitted by the radiation sources (e.g. LEDs) at different times such that each image captured by the imaging detector 16 is generated by a particular wavelength of radiation. In an embodiment, the radiation sources may be modulated. The radiation sources may operate in sequence, and the processor may take the sequence into account when processing the images captured by the imaging detector 16. This may be considered to be multiplexing of the different alignment radiation wavelengths emitted by the radiation sources and subsequent de-multiplexing of the images captured by the imaging detector 16. In an embodiment, the radiation sources which emit different wavelengths may each be modulated at a different frequency. This allows the detected images to be de-multiplexed by using those frequencies. The frequencies may, for example, be in the kHz range (e.g. between 1 kHz and 1 MHz). The radiation sources (which may be LEDs) may be modulated using known methods such as, for example, modulating driver currents or using chopper wheels.

It may be desirable to monitor for tilting of an alignment mark P1, P2. Such tilting may occur, for example, when a layer of metal has been deposited on the substrate W and then polished. If the polishing is not fully parallel with the top of ridges of the alignment mark P1, P2, then the ridges will be polished at an angle. In other words, the tops of the ridges will now be tilted—i.e. will not lie in the x, y plane. This form of asymmetry of the alignment mark P1, P2 may introduce an error into the measured position of the alignment mark. This tilting (which may be considered to be a form of asymmetry) will cause a shift of images at the imaging detector 16, and hence will cause a shift of the measured position of the alignment mark P1.

One method of correcting for tilting of an alignment mark is to measure the tilt and then apply a correction to the measured alignment mark position which takes that tilt into account. Measuring the tilt may be thought of as reconstructing the gratings of the alignment mark P1.

Referring to FIG. 2, instead of generating alignment radiation beam poles 4a and 4b simultaneously using a radiation source, one radiation source may be used to generate the first pole 4a and a different radiation source may be used to generate the second pole 4b at a different time. One way of achieving this is to provide a dedicated optical fibre which carries alignment radiation from a source to the first pole 4a, and a different dedicated optical fibre which carries alignment radiation from a source to the second pole 4b. If the alignment mark P1 suffers from tilt then the intensity of the image formed from the first pole 4a (the image being formed from zero and $-1^{st}$ order radiation) will be different from the intensity of the image formed from the second pole 4b (the image being formed from zero and $1^{st}$ order radiation). The difference between the intensities of the alignment mark images seen at the imaging detector 16 will yield additional information regarding the tilt of the alignment mark P1. The same approach may be used for the third and fourth poles 4c, 4d of alignment radiation.

In an embodiment, separate LEDs may be provided for each of the four poles which are used to illuminate the alignment mark P1, P2. The LEDs may all operate at the same wavelength. The LEDs may be modulated to operate in sequence or, alternatively, may be modulated at different frequencies. The modulation allows images resulting from each of the incident alignment beam poles 4a-d to be separated from each other and analysed by the processor PR.

Additional information which can be used to construct gratings of the alignment mark may be obtained by using different wavelengths of alignment radiation (the use of different wavelengths of alignment radiation is discussed above). In an embodiment, a combination of the use of individual radiation poles and the use of different wavelengths may be used. Modulation, for example at different frequencies, may be used to distinguish between poles and to distinguish between wavelengths. A plurality of poles may share the same wavelength of radiation or may instead comprise different wavelengths of radiation.

Figure 4:
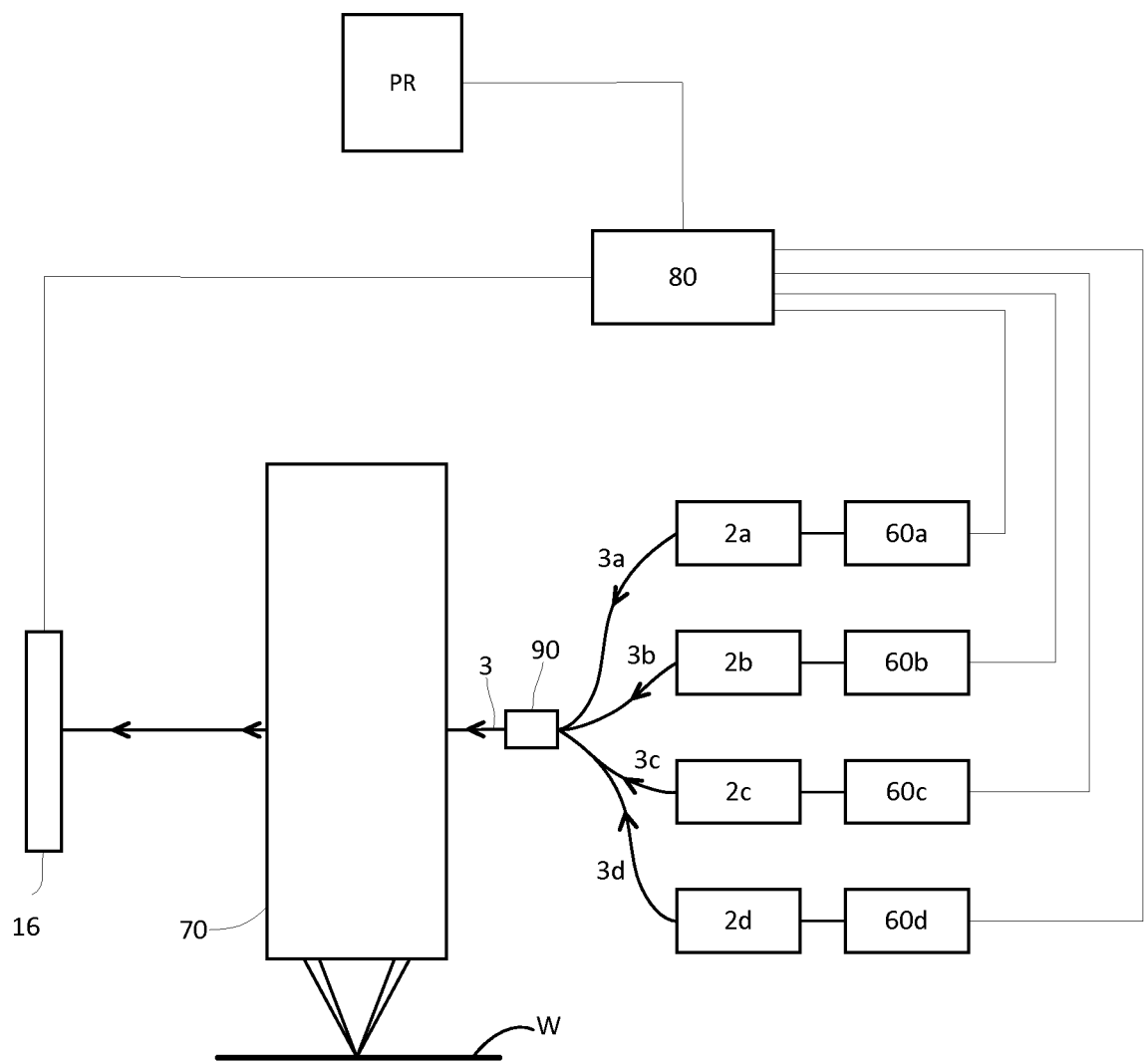
FIG. 4 schematically depicts an alignment system according to another embodiment of the invention.

The alignment radiation beam sources may be modulated. FIG. 4 is a schematic depiction of an alignment system according to such an embodiment of the invention. In the example of FIG. 4, four alignment radiation beam sources 2a-d are coupled to four optical fibres 3a-d respectively. The alignment radiation beam sources 2a-d may, for example, be light emitting diodes, super luminescent diodes, lasers or any other suitable means of providing alignment radiation beams for the alignment system. A larger or smaller number of alignment radiation beam sources and optical fibres may be used. The optical fibres 3a-d couple into a single optical fibre 3 via fibre coupler 90. Alignment radiation is transported by the optical fibre 3 to components 70 which correspond with components depicted within dashed line 70 in FIG. 2. That is, alignment radiation is directed to different poles, passes through optics 20 and beam splitter 6, and is incident upon a substrate W. The alignment radiation then passes through self-referencing optical system 8 and lens 26. To avoid an unnecessarily complicated schematic in FIG. 4 the components within box 70 in FIG. 2 are represented as block 70 in FIG. 4.

Four modulators 60a-d apply modulation to the alignment radiation beam sources 2a-d. The modulators 60a-d may, for example, modulate an amplitude of the alignment radiation beams. The modulators 60a-d may alternatively modulate a phase of the alignment radiation beams as described further below with reference to FIG. 6. The modulators 60a-d may, for example, provide modulating driver currents to each alignment radiation beam source 2a-d. The modulators 60a-d may alternatively provide a modulating voltage to each alignment radiation beam source. The modulators 60a-d apply a different modulation to each alignment radiation beam source 2a-d. Information regarding the modulation being applied by the modulators 60a-d is provided to a phase sensitive signal detector 80. The phase sensitive signal detector 80 may, for example, comprise a lock-in amplifier. The modulation information provided to the phase sensitive signal detector 80 may include, for example, a frequency and phase of the modulation that is being provided to each alignment radiation beam source.

Two images of the alignment mark that are rotated by around 180 degrees with respect to one another are formed at the imaging detector 16. The imaging detector 16 detects a spatial distribution of an intensity of the two images of the alignment mark. This may be referred to as a compound image. The imaging detector 16 provides an output signal indicative of a spatial distribution of an intensity of the two images of the alignment mark to the phase sensitive signal detector 80. The imaging detector 16 may, for example, be a photodiode, an array of photodiodes, a CCD device or any other detector capable of detecting images. More than one imaging detector 16 may be provided.

The phase sensitive signal detector 80 is configured to receive the output signal provided by the imaging detector 16, and use the modulation information provided by the modulators 60a-d to discriminate between the plurality of alignment mark images formed at the imaging detector 16. That is, the phase sensitive signal detector 80 receives input signals from the imaging detector 16 and the modulators 60a-d and uses the modulation to discriminate between the images of the alignment mark detected by the imaging detector 16. The discrimination of alignment mark images is based on the modulation of the alignment radiation beam sources 60a-d. The images of the alignment mark are discriminated according to the alignment radiation beam that produced the alignment mark images.

Thus, for example, a modulator 60a applies a modulation to an alignment radiation beam source 2a. Alignment radiation beam source 2a emits a modulated alignment radiation beam through an optical fibre 3a. The optical fibre 3a is coupled with other optical fibres 3b-d into a single optical fibre 3 by a fibre coupler 90. The single optical fibre 3 provides an alignment radiation beam to the components represented by dashed line 70 in FIG. 2. The alignment radiation beam exits the components represented by dashed line 70 in FIG. 2 and is incident on an alignment mark on a substrate W. The alignment radiation beam then re-enters the components represented by dashed line 70 in FIG. 2. The alignment radiation beam exits the components represented by dashed line 70 in FIG. 2 and is incident upon the imaging detector 16. The imaging detector 16 provides an output signal indicative of a spatial distribution of an intensity of the two images of the alignment mark formed by alignment radiation beams emitted by each alignment radiation beam source 2a-d to the phase sensitive signal detector 80. The modulator 60a provides modulation information to phase sensitive signal detector 80. The phase sensitive signal detector 80 uses the modulation information provided by the modulator 60a to discriminate the images of the alignment mark formed by the alignment radiation beam emitted by the alignment radiation beam source 2a from alignment mark images formed by alignment radiation beams emitted by other alignment radiation beam sources 2b-d. The phase sensitive signal detector 80 provides an output signal indicative of the discriminated alignment mark images to a processor PR. The processor PR is configured to analyse the discriminated alignment mark images to determine the position of the alignment mark relative to the alignment system.

The components of the alignment system that contribute to producing two images of the alignment mark that are rotated by around 180 degrees with respect to one another may be referred to as a first system. For example, the first system may comprise the alignment radiation beam sources 2a-d, optical fibres 3a-d, the fibre coupler 90, the optical fibre 3 and the components represented by dashed line 70 in FIG. 2. The first system may comprise other components. The components of the alignment system that are used to determine the position of the alignment mark from a spatial distribution of an intensity of the two images may be referred to as a second system. That is, the second system may comprise the modulators 60a-d, the imaging detector 16, the phase sensitive signal detector 80 and the processor PR. The second system may comprise other components.

Figure 5:
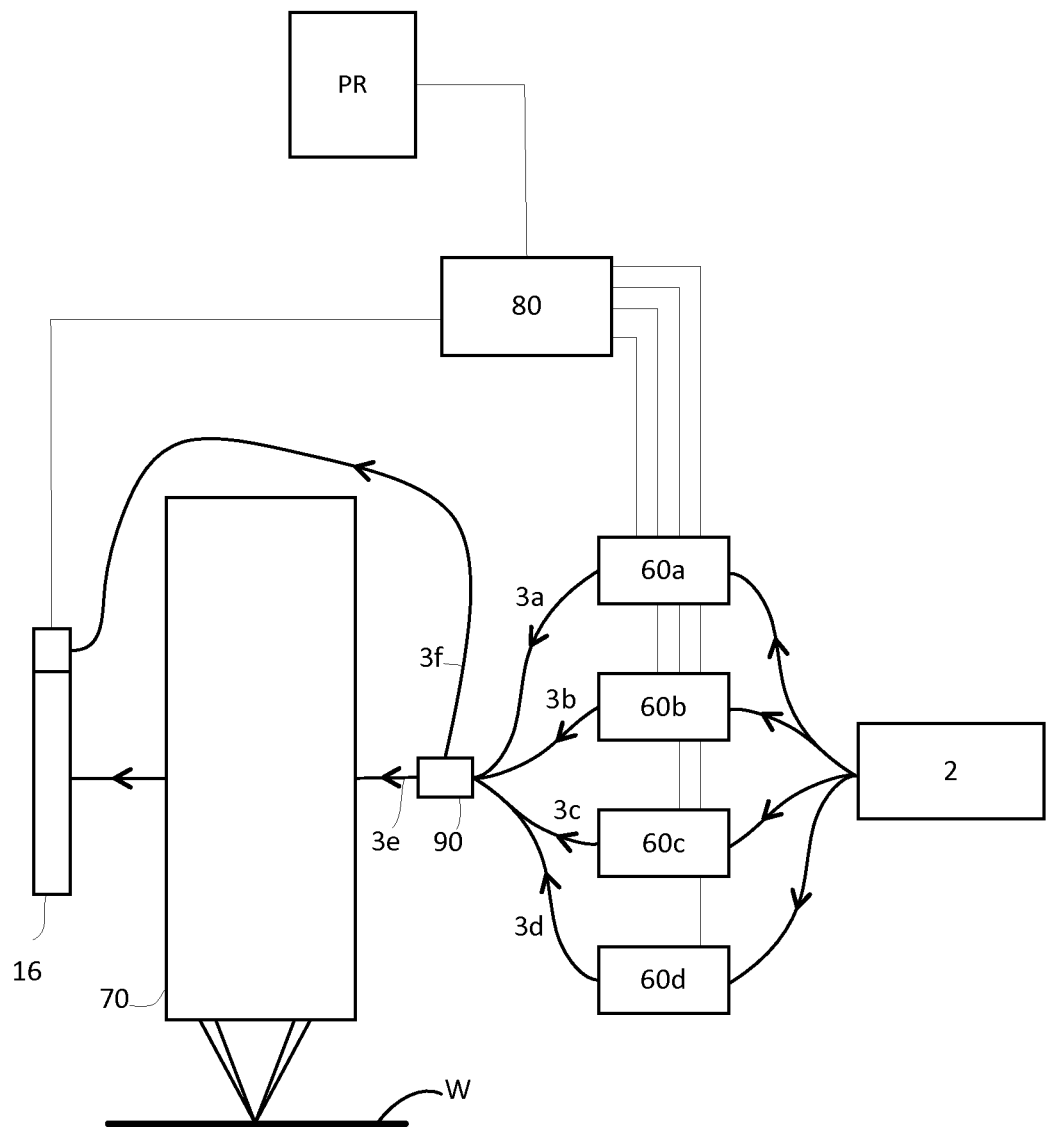
FIG. 5 schematically depicts an alignment system according to another embodiment of the invention.

In an embodiment, modulation may be provided to the alignment radiation beams after they have been emitted by the alignment radiation beam sources. That is, external modulators may be used to modulate the alignment radiation beams instead of modulating the alignment radiation beam sources. FIG. 5 is a schematic depiction of an alignment system according to such an embodiment of the invention. An alignment radiation beam source 2 provides four alignment radiation beams to four external modulators 60a-d. In the example of FIG. 5, one alignment radiation beam source 2 is coupled to four external modulators 60a-d, which in turn are coupled to four optical fibres 3a-d respectively. The alignment radiation beam source 2 may, for example, be a light emitting diode, a super luminescent diode, a laser or any other suitable means of providing alignment radiation beams for the alignment system. A larger or smaller number of alignment radiation beam sources, external modulators and optical fibres may be used.

The alignment radiation beam source 2 may be capable of providing radiation across a range of wavelengths, e.g. within the range 400-1000 nm. Other wavelengths may be used. The alignment radiation beam source 2 is configured to provide alignment radiation beams, each having a different wavelength, to external modulators 60a-d. The use of external modulators 60a-d enables a single alignment radiation beam source 2 to be used rather than multiple alignment radiation beam sources because the alignment radiation beams are modulated after being emitted rather than whilst being generated.

The external modulators 60a-d are configured to apply modulation to the alignment radiation beams. The external modulators 60a-d modulate each alignment radiation beam with a different frequency and phase. For example, the modulator 60a provides a modulation having a first frequency and a first phase to the alignment radiation beam carried by optical fibre 3a. Another modulator 60b provides a modulation having a second frequency and a second phase to the alignment radiation beam carried by optical fibre 3*b*. The external modulators 60*a-d* may comprise optical choppers such as, for example, chopper wheels. The external modulators 60*a-d* may comprise electro-optic or acousto-optic modulators. Modulation information from the external modulators 60*a-d* is provided to the phase sensitive signal detector 80.

Once modulated, the alignment radiation beams pass through optical fibres 3*a-d*. Optical fibres 3*a-d* are coupled into a single optical fibre via fibre coupler 90. The single optical fibre is then split into two optical fibres 3*e, f*. The first optical fibre 3*e* transports alignment radiation towards components represented by block 70 (i.e. components depicted in FIG. 2 within dashed line 70). The alignment radiation beam exiting the components represented by block 70 is incident on the imaging detector 16. The second optical fibre 3*f* transports alignment radiation directly to the imaging detector 16.

In the example of FIG. 5, the imaging detector 16 is a balanced photodetector. The balanced photodetector may, for example, comprise a photodiode, an array of photodiodes, a CCD device, a CMOS device or any other detector capable of detecting images. The balanced photodetector may receive two beams of alignment radiation as two different inputs. For example, the balanced photodetector may comprise two independent radiation-sensitive detector areas that are configured to receive first and second inputs independently of each other. The balanced photodetector is configured to receive a beam of alignment radiation from an optical fibre 3*f* as a first input, and receive images of the alignment mark from the components represented by block 70 as a second input. For example, a single pixel may receive the beam of alignment radiation from the optical fibre 3*f* whereas an independent array of pixels may receive the images of the alignment mark. The balanced photodetector is configured to provide an output signal to the phase sensitive signal detector 80 that is indicative of a difference between the two inputs. For example, noise originating from the alignment radiation beam source 2 and/or the external modulators 60*a-d* that is present in both inputs provided to the balanced photodetector may be reduced by the balanced photodetector. The balanced photodetector may provide an output signal having an improved signal-to-noise ratio to the phase sensitive signal detector 80. A balanced photodetector may also be used in conjunction with other embodiments of the present invention.

The phase sensitive signal detector 80 receives an output signal from the imaging detector 16 and receives output signals from the modulators 60*a-d*. The phase sensitive signal detector 80 discriminates between alignment mark images detected by the imaging detector 16 and provides an output signal indicative of the discriminated alignment mark images to processor PR. The processor PR is configured to analyse the discriminated alignment mark images to determine the position of the alignment mark relative to the alignment system. The processor PR receives an output image from the imaging detector 16 for each position of the substrate W relative to the alignment system. Each output image may be considered to be a spatial distribution of an intensity of the first and second images of the alignment mark P1. The spatial distribution of an intensity of the two overlapping images is analysed by the processor PR to determine a substrate W position at which the alignment mark P1 is aligned with the alignment system AS. This may for example correspond to a position in which the first and second images most fully overlap with each other.

The components of the alignment system that contribute to producing two images of the alignment mark that are rotated by around 180 degrees with respect to one another may be referred to as a first system. For example, the first system may comprise the alignment radiation beam source 2, optical fibres 3*a-d*, the fibre coupler 90, the optical fibre 3*e* and the components represented by dashed line 70 in FIG. 2. The first system may comprise other components. The components of the alignment system that are used to determine the position of the alignment mark from a spatial distribution of an intensity of the two images may be referred to as a second system. That is, the second system may comprise the modulators 60*a-d*, the optical fibre 3*f*, the imaging detector 16, the phase sensitive signal detector 80 and the processor PR. The second system may comprise other components.

Figure 6:
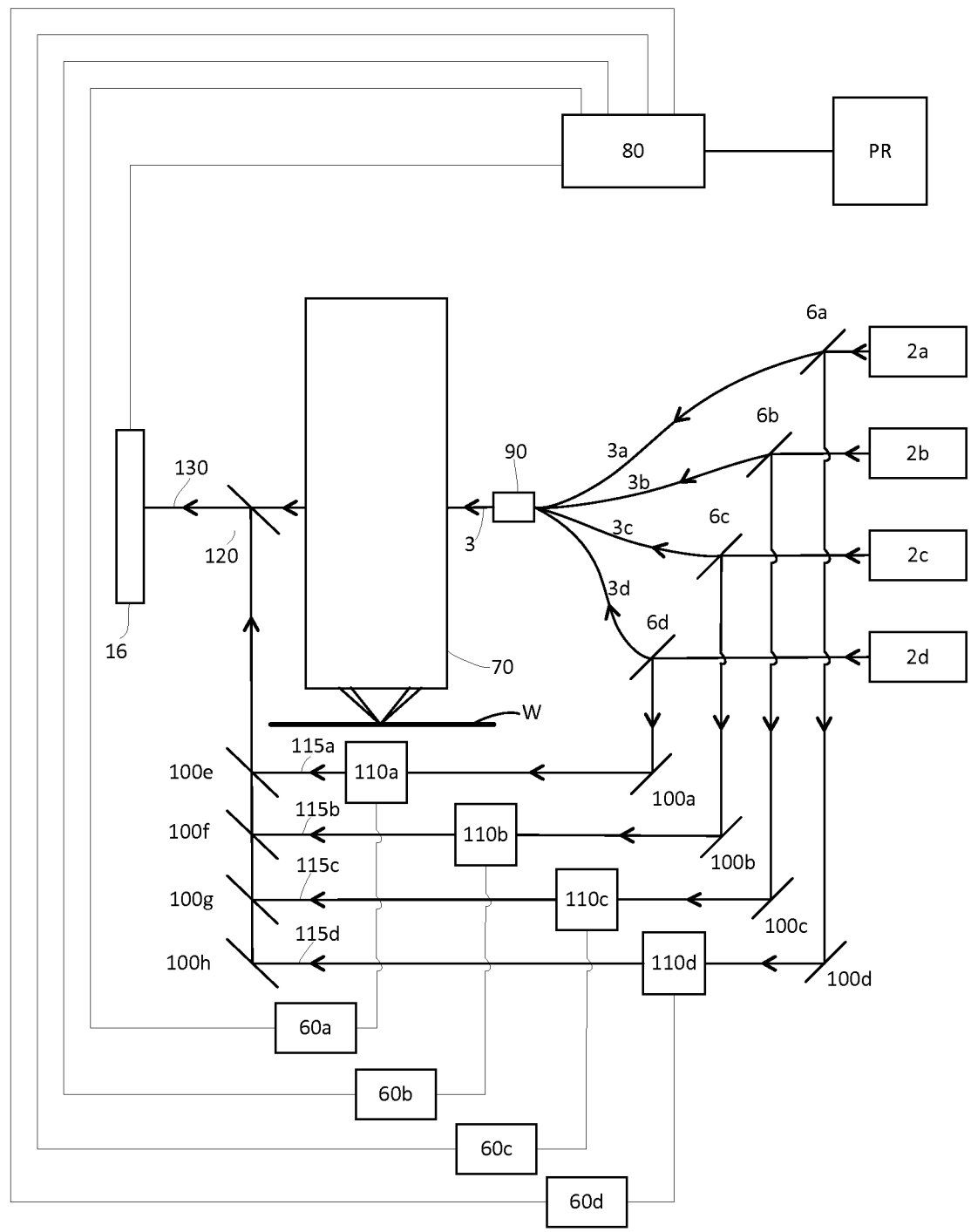
FIG. 6 schematically depicts an alignment system according to another embodiment of the invention.

In an embodiment, a phase of the alignment radiation beams may be modulated. FIG. 6 is a schematic depiction of an alignment system according to such an embodiment of the invention. Alignment radiation beam sources 2*a-d* provide alignment radiation beams to beam splitters 6*a-d*. A single alignment radiation beam source capable of providing radiation across a range of wavelengths, e.g. within the range 400-1000 nm, may be provided instead of separate radiation sources 2*a-d*. Other wavelengths may be used. The alignment radiation beams are split between optical fibres 3*a-d* and reflectors 100*a-d*. The alignment radiation beams passing through optical fibres 3*a-d* are coupled into a single alignment radiation beam and are provided to the components represented by the dashed line 70 in FIG. 2. The alignment radiation beams reflected from reflectors 100*a-d* pass to phase modulators 110*a-d*. These alignment radiation beams may be referred to as reference alignment radiation beams 115*a-d*. The phase modulators 110*a-d* are configured to modulate the phase of the reference alignment radiation beams 115*a-d*. The phase modulators 110*a-d* may comprise acousto-optic modulators. The phase modulators 110*a-d* may comprise electro-optic modulators such as, for example, Pockels cells.

The phase modulators 110*a-d* are driven by modulators 60*a-d*. The modulators 60*a-d* may provide a modulating electronic signal to phase modulators 110*a-d* that causes the phase modulators to alter the phase of the reference alignment radiation beams 115*a-d*. Modulation information is provided by the modulators 60*a-d* to a phase sensitive signal detector 80. The phase sensitive signal detector 80 may, for example, comprise a lock-in amplifier. Reference alignment radiation beams 115*a-d* that have been modulated by the phase modulators 110*a-d* are incident upon reflectors 100*e-h* respectively. The reflectors 100*e-h* direct the reference alignment radiation beams 115*a-d* towards a beam combiner 120. The beam combiner 120 combines the alignment radiation beams with the reference alignment radiation beams 115*a-d* to form a combined beam 130. The combined beam 130 is incident on the imaging detector 16. The imaging detector 16 may, for example, be a photodiode, an array of photodiodes, a CCD device or any other detector capable of detecting images. More than one imaging detector 16 may be provided.

Interference occurs at the imaging detector 16 between reference alignment radiation beams 115*a-d* and alignment radiation beams having the same wavelength. Significant interference does not occur between alignment radiation beams that form the two overlapping images of the alignment mark at the imaging detector 16. The reference alignment radiation beams 115*a-d* and the alignment radiation beams may be coherent with each other in order to interfere.

The word "coherent" as used here is intended to indicate that an alignment radiation beam and a reference alignment radiation beam having the same wavelength and polarisation are able to interfere with one another at the imaging detector 16. The word "coherent" is not intended to indicate that the alignment radiation beam sources have a long coherence length.

Radiation sources having a long coherence length may be unsuitable for use with the alignment system because interference effects such as, for example, speckle may reduce the accuracy of measurements made using the alignment system. For this reason, a non-coherent alignment radiation beam source is preferred. However, it is to be understood that the alignment system is not restricted for use with non-coherent alignment radiation beam sources only, and that alignment radiation beam sources having a long coherence length, such as lasers, may be used. The optical path length of the reference alignment radiation beams may be equivalent to the optical path length of the alignment radiation beams within a coherence length of the alignment radiation beam sources 2a-d. That is, the difference between the optical path length of the reference alignment radiation beams and the alignment radiation beams may be less than the coherence length of the alignment radiation beam sources 2a-d. The optical paths of the reference alignment radiation beams and the alignment radiation beam may, for example, be thought of as the arms of a Mach-Zehnder interferometer.

The alignment radiation beam sources 2a-d may, for example, be light emitting diodes, super luminescent diodes, lasers or any other suitable means of providing alignment radiation beams for the alignment system. The alignment radiation beam sources 2a-d may be considered as having a short coherence length, e.g. LEDs having a coherence length that is less than 100 µm such as, for example 10 µm. However, in practice any radiation source has some coherence. The optical path lengths of the reference alignment radiation beams and the alignment radiation beam may be designed to ensure that interference between the reference alignment radiation beams and the alignment radiation beam occurs at the imaging detector 16 despite the radiation sources 2a-d having a coherence length that is considered as being short, e.g. less than 100 µm.

Interference between the reference alignment radiation beam and the alignment radiation beam converts the phase modulation to an amplitude modulation that is detected by the imaging detector 16 as a modulation of a spatial distribution of an intensity of overlapping alignment mark images. The spatial distribution of an intensity of two overlapping alignment mark images detected by the imaging detector 16 depends upon the interference between a reference alignment radiation beam and an alignment radiation beam sharing the same wavelength. Interference between a reference alignment radiation beam and an alignment radiation beam sharing the same wavelength depends upon the modulation of the phase of the reference alignment radiation beam. The intensity of radiation having a particular wavelength detected by the imaging detector 16 therefore depends upon the modulation of the phase of a reference alignment radiation beam having that particular wavelength.

The compound image of the alignment mark detected by the imaging detector 16 is still formed via a non-interfering sum of two overlapping images. However, the intensity of the two images detected by the imaging detector 16 varies according to the phase modulation of their respective reference alignment radiation beam. That is, interference only occurs between an alignment radiation beam and a reference alignment radiation beam having the same wavelength and polarization. The reference alignment radiation beam does not contain any information regarding the alignment mark. It will be understood by a person skilled in the art that for interference to occur between an alignment radiation beam and a reference alignment radiation beam at the imaging detector 16 the wavelengths, polarizations, coherence lengths and optical path lengths of the radiation beams should be considered when designing the alignment system. For example, an alignment system having a first design may comprise alignment radiation beam sources having a coherence length of approximately 500 µm, and the optical path lengths of the alignment radiation beams and the reference alignment radiation beams have a difference of less than 500 µm. Another alignment system having a second design may comprise alignment radiation beam sources having a coherence length of approximately 10 µm, and the optical path lengths of the alignment radiation beams and the reference alignment radiation beams have a difference of less than 10 µm.

The imaging detector 16 provides an output signal to the phase sensitive signal detector 80 that is indicative of a spatial distribution of an intensity of the two images of the alignment mark that are formed on the imaging detector 16. The phase sensitive signal detector 80 receives an output signal from imaging detector 16 and receives output signals from modulators 60a-d. The phase sensitive signal detector 80 discriminates between alignment mark images detected by the imaging detector 16 and provides an output signal indicative of the discriminated alignment mark images to processor PR. The processor PR is configured to analyse the discriminated alignment mark images to determine the position of the alignment mark relative to the alignment system. The processor PR receives an output image from the imaging detector 16 for each position of the substrate W relative to the alignment system. Each output image may be considered to be a spatial distribution of an intensity of the first and second images of the alignment mark P1. The spatial distribution of an intensity of the two images is analysed by the processor PR to determine a substrate W position at which the alignment mark P1 is aligned with the alignment system AS. This may for example correspond to a position in which the first and second images most fully overlap with each other.

The components of the alignment system that contribute to producing two images of the alignment mark that are rotated by around 180 degrees with respect to one another may be referred to as a first system. For example, the first system may comprise the alignment radiation beam sources 2a-d, optical fibres 3a-d, the fibre coupler 90, the optical fibre 3 and the components represented by dashed line 70 in FIG. 2. The first system may comprise other components. The components of the alignment system that are used to determine the position of the alignment mark from a spatial distribution of an intensity of the two images may be referred to as a second system. That is, the second system may comprise the reflectors 6a-d, the reflectors 100a-h, the phase modulators 110a-110d, the modulators 60a-d, the beam combiner 120, the imaging detector 16, the phase sensitive signal detector 80 and the processor PR. The second system may comprise other components.

The number of alignment radiation beam sources provided to the alignment system may be greater or less than four. The number of alignment radiation beams provided to the alignment system may be greater or less than four. The number of modulators provided to the alignment system may be greater or less than four. The number of optical fibres provided to the alignment system may be greater or less than the number of optical fibres shown in the example embodiments depicted herein. The number of imaging detectors provided may be greater or less than the number of imaging detectors shown in the example embodiments depicted herein. The imaging detector may be a balanced imaging photodetector.

In an embodiment in which different wavelengths of illumination are used and each pole is generated using a different radiation beam source, the number of radiation beam sources may be scaled accordingly. For example, sixteen radiation beam sources (e.g. LEDs) may be used to generate four different poles at four different wavelengths. In such an embodiment four radiation beam sources operating at different wavelengths may be coupled to a single optical fibre which delivers alignment radiation as one alignment beam pole. For different radiation beam sources operating at those wavelengths may be coupled to a single optical fibre which delivers alignment radiation as another alignment beam pole, etc. In general, any number of wavelengths may be used.

Any suitable source of alignment radiation may be used, such as for example LEDs as mentioned above. The alignment radiation beam source may be non-coherent in order to avoid interference effects caused by unwanted reflections occurring within the alignment system. Such interference may cause significant speckle at the imaging detector 16 and this may reduce the accuracy of measurements obtained using the alignment system AS. The term "significant speckle" as used here is intended to indicate an amount of speckle that would negatively affect the accuracy of the alignment system. It would be understood by a person skilled in the art that the range of alignment radiation beam source coherence lengths that avoid significant speckle occurring within an alignment system will depend on the characteristics of the alignment system in question. The self-referencing optical system 8 separates polarisations and generates two alignment mark images with substantially orthogonal polarisation. This separation of polarisations may be sufficiently complete to avoid interference between alignment mark images even if the alignment radiation includes some coherence. Thus, in some embodiments lasers may be used as the alignment radiation beam sources.

In general, the alignment system may use any suitable radiation source, provided that a non-interfering sum of alignment mark images is provided at the imaging detector 16. That is, alignment mark images add together at the imaging detector 16 without significant interference between images occurring. The term "significant interference" may be interpreted as meaning interference which has a detrimental effect upon the accuracy with which the position of the alignment mark is determined by the alignment system.

In an embodiment, the imaging detector may be located outside of the environment in which the substrate W is present. Where this is the case, an array of optical fibres may be arranged to receive the alignment radiation beam and then transport that alignment radiation beam to the imaging detector. An advantage of this arrangement is that the imaging detector is outside of the controlled environment and is easily accessible. Furthermore, contamination due to outgassing from the imaging detector is avoided. In addition, removal of heat from the imaging detector is made more straightforward.

In an embodiment, instead of moving the substrate in the x-direction in order to determine the x-direction position of the alignment mark P1 and then moving the substrate in the y-direction in order to determine the y-direction position, the substrate may be moved diagonally (e.g. in the x=y direction). Where this is the case, the processor PR may analyse images output from the imaging detector 16 to determine both the x-direction position and the y-direction position of the alignment mark P1.

Although described embodiments of the invention use an alignment mark P1 which comprises gratings extending in the x and y directions, other forms of alignment mark may be used. Because the self-referencing optical system 8 is self-referencing, the alignment mark is referenced against itself when determining the position of the alignment mark. This means that the alignment mark is not constrained to be a particular form. This is advantageous compared with some prior art alignment systems in which an imaging detector is provided with a mark fixed onto the imaging sensor itself and the position of an alignment mark image is compared with the position of the fixed mark. For example, in a prior art system two non-transmissive bars are provided on an imaging detector and the position of an alignment mark image with respect to those two bars is determined. This relies upon the alignment mark having a form which allows for a comparison of its image position with the positions of the bars. In contrast to this, embodiments of the invention reference the alignment mark with itself and thus do not require bars or other features to be provided on the imaging detector. Any mark which is symmetric for rotation through 180° will, due to the action of the self-referencing optical system, form a pair of images which can be used to determine the position of that mark. Because embodiments of the invention use an imaging detector 16, prior knowledge of the type of the alignment mark is not required. The processor PR can determine the type of the alignment mark by analysing images received at the imaging detector 16, and can determine the aligned position of the alignment mark by looking at overlap between the received images (as described further above). Embodiments of the invention thus provide significant flexibility regarding the type of the alignment mark.

Alignment marks used by embodiments of the invention may be small, for example measuring around 10 microns by 10 microns or less. These small alignment marks may be easily overfilled by an alignment radiation beam spot (as described further above) thereby allowing straightforward selection of a region of interest (i.e. images of the alignment mark). Using small alignment marks is advantageous because the alignment marks occupy less space on the substrate and therefore allow more space to be used for products such as integrated circuits.

Although illustrated embodiments of the invention use a self-referencing optical system which comprises a polarising beam splitter and a pair of corner cube reflectors, any form of self-referencing optical system may be used. For example, a self-referencing optical system having a Mach-Zehnder configuration but including image rotation in one arm may be used. The term "self-referencing optical system" may be interpreted as meaning an optical system which provides two images of an object, the relative positions of the images depending upon the position of the optical system with respect to the object. One of the images may be rotated relative to the other image.

Using a polarising beam splitter 6 as depicted in FIG. 2 is just one example of illuminating an alignment mark and directing reflected radiation towards a detector. In another example a beam splitter which is around 50% reflective and which does not rely upon radiation polarisation may be used. In this example 75% of the alignment radiation will be lost via the combination of an initial reflection of 50% of the alignment radiation and then transmission of 50% of the reflected alignment radiation. Where an arrangement such as this is used which does not discriminate between polarisations, modulation of polarisations may be used in a manner which is analogous to modulation of wavelengths as described above. This allows alignment mark images as generated by different polarisations of alignment radiation to be received and analysed by the processor PR.

One of more of the lenses 20, 21, 26 referred to in the above description may comprise a plurality of optical elements. The optical elements may be refractive (as illustrated) or may be reflective.

In an embodiment, variation between intensities of different images generated for example by different wavelengths, may be corrected for by using an average of the intensity of alignment radiation received across the imaging detector 16 for each wavelength.

Embodiments of the invention may use methods and/or apparatus which is described in U.S. Pat. No. 6,961,116, which is herein incorporated by reference. Embodiments of the invention may use methods and/or apparatus which is described in WO2014/026819, which is herein incorporated by reference. Embodiments of the invention may use methods and/or apparatus which is described in WO2014/068116, which is herein incorporated by reference.

In an embodiment, an alignment system according to the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An alignment system for determining the position of an alignment mark, the alignment system comprising:
   a first system configured to produce two overlapping images of the alignment mark that are rotated by around 180 degrees with respect to one another; and
   a second system configured to determine the position of the alignment mark from a compound image comprising a spatial distribution of an intensity of the two overlapping images, wherein the compound image is formed by an incoherent sum of the two overlapping images,
   wherein the first system comprises optics that are configured to overfill the alignment mark with an alignment radiation beam.

2. The alignment system of claim 1, wherein the first system comprises a non-coherent alignment radiation beam source configured to illuminate the alignment mark with the alignment radiation beam.

3. The alignment system of claim 1, wherein the second system comprises an imaging detector configured to detect the spatial distribution of the intensity of the two overlapping images of the alignment mark without scanning the alignment mark and provide an output signal indicative of the spatial distribution of the intensity of the two overlapping images of the alignment mark.

4. The alignment system of claim 1, wherein the second system comprises a processor configured to determine the position of the alignment mark by analyzing the spatial distribution of the intensity of the two overlapping images for a plurality of different positions of the alignment mark relative to the alignment system.

5. The alignment system of claim 1, wherein the first system comprises a plurality of alignment radiation beam sources configured to provide alignment radiation beams which illuminate the alignment mark and produce a plurality of images of the alignment mark.

6. The alignment system of claim 5, wherein the plurality of alignment radiation beam sources are configured to emit alignment radiation beams with different wavelengths.

7. The alignment system of claim 5, wherein the plurality of alignment radiation beam sources are configured to provide separate alignment radiation beams which have different positions in a pupil plane.

8. The alignment system of claim 5, wherein the plurality of alignment radiation beam sources are modulated.

9. The alignment system of claim 1, wherein the first system comprises:
   one or more alignment radiation beam sources configured to illuminate the alignment mark with a plurality of alignment radiation beams; and
   a modulator configured to modulate an alignment radiation beam.

10. The alignment system of claim 1, wherein the second system comprises:
    a phase sensitive signal detector configured to receive a signal indicative of:
      the modulation of a first alignment radiation beam;
      the modulation of a second alignment radiation beam;
      the spatial distribution of the intensity of the two overlapping images formed by the first alignment radiation beam; and
      the spatial distribution of the intensity of the two overlapping images formed by the second alignment radiation beam,
    wherein the phase sensitive detector is further configured to discriminate between the two overlapping images formed by the first alignment radiation beam and the two overlapping images formed by the second alignment radiation beam.

11. The alignment system of claim 1, wherein the first system comprises a balanced photodetector.

12. The alignment system of claim 1, further comprising:
    four alignment radiation beam sources each being configured to provide the alignment radiation beam as one pole of a quadrupole illumination mode.

13. A lithographic apparatus comprising:
    at least two substrate tables configured to hold substrates;
    a projection system configured to project a patterned radiation beam onto a target portion of a substrate held by one of the substrate tables; and
    an alignment system configured to determine a position of an alignment mark on a substrate held by the other substrate table, the alignment system comprising:
      a first system configured to produce two overlapping images of the alignment mark that are rotated by around 180 degrees with respect to one another; and
      a second system configured to determine the position of the alignment mark from a compound image comprising a spatial distribution of an intensity of the two overlapping images, wherein the compound image is formed by an incoherent sum of the two overlapping images, wherein the first system comprises optics that are configured to overfill the alignment mark with an alignment radiation beam.

14. A method of determining a position of an alignment mark comprising:
    producing two overlapping images of the alignment mark that are rotated by around 180 degrees with respect to one another, wherein the alignment mark is overfilled with an alignment radiation beam;
    forming a compound image by an incoherent sum of the two overlapping images, wherein the compound image comprises a spatial distribution of an intensity of the two overlapping images; and
    determining the position of the alignment mark from the spatial distribution of the intensity of the two overlapping images.

15. A lithographic apparatus comprising:
    a substrate table configured to hold a substrate; and
    an alignment system configured to determine a position of an alignment mark on the substrate held by the substrate table, the alignment system comprising:
      a first system configured to produce two overlapping images of the alignment mark that are rotated by around 180 degrees with respect to one another; and
      a second system configured to determine the position of the alignment mark from a compound image comprising a spatial distribution of an intensity of the two overlapping images, wherein the compound image is formed by an incoherent sum of the two overlapping images, wherein the first system comprises optics that are configured to overfill the alignment mark with an alignment radiation beam.

* * * * *